(12) United States Patent
Fukunaga

(10) Patent No.: US 8,015,696 B2
(45) Date of Patent: **\*Sep. 13, 2011**

(54) DEVICE FOR MOUNTING LIGHT EMITTING ELEMENT

(75) Inventor: Shigeki Fukunaga, Higashiomi (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 231 days.

This patent is subject to a terminal disclaimer.

(21) Appl. No.: 12/273,949

(22) Filed: Nov. 19, 2008

(65) Prior Publication Data

US 2009/0133248 A1 May 28, 2009

Related U.S. Application Data

(62) Division of application No. 10/573,058, filed as application No. PCT/JP2004/013111 on Sep. 9, 2004, now Pat. No. 7,540,080.

(30) Foreign Application Priority Data

Sep. 22, 2003 (JP) ................................. 2003-329318

(51) Int. Cl.
B23P 19/00 (2006.01)
(52) U.S. Cl. ................ 29/740; 29/739; 29/743
(58) Field of Classification Search ............ 29/729, 29/739–743, 832–834, 705, 712–721; 348/687; 438/692
See application file for complete search history.

(56) References Cited

U.S. PATENT DOCUMENTS 5,379,514 A 1/1995 Okuda et al.
6,599,769 B2 7/2003 Kondo et al.
(Continued)

FOREIGN PATENT DOCUMENTS

JP 07-046474 2/1995
(Continued)

OTHER PUBLICATIONS

International Search Report PCT/JP2004/013111 dated Dec. 21, 2004.
(Continued)

*Primary Examiner* — Minh Trinh
(74) *Attorney, Agent, or Firm* — Keating & Bennett, LLP

(57) ABSTRACT

A method and apparatus for mounting a light emitting element, enabling positioning on an object with precision with reference to the optic axis of a light emitting element, and mounting the element. A suction head is inserted between a first camera and a second camera having relatively fixed optic axes, a head reference mark of the suction head is captured with the first camera, the end face of a light emitting element suctioned by the suction head is captured with the second camera, the light axis emitted by the light emitting element is captured with a third camera, a stage is inserted between the first camera and the second camera, a board held on the stage is captured with the first camera, a stage reference mark of the stage is captured with the second camera, the relative position between the light emitting element and the suction head and the relative position between the board and the stage are calculated using the image information from both cameras, the suction head and the stage are moved to a mounting position, the head reference mark and the stage reference mark are recognized with the first and second cameras, and the suction head and the stage are subjected to position correction based on the relative position information.

5 Claims, 10 Drawing Sheets

U.S. PATENT DOCUMENTS

| | | | |
|---|---|---|---|
| 7,134,188 B2 * | 11/2006 | Fukunaga | 29/740 |
| 7,200,926 B2 | 4/2007 | Fukunaga | |
| 7,540,080 B2 * | 6/2009 | Fukunaga | 29/832 |

FOREIGN PATENT DOCUMENTS

| | | |
|---|---|---|
| JP | 07-105575 | 4/1995 |
| JP | 2000-150970 | 5/2000 |

OTHER PUBLICATIONS

Chinese Office Action issued Jul. 20, 2007 in corresponding Chinese Application No. 200480027080.4 with English language translation.

Chinese Office Action issued Jan. 25, 2008 in corresponding Chinese Application No. 200480027080.4 with English language translation.

* cited by examiner

VISUAL FIELD OF THIRD CAMERA

DEVICE FOR MOUNTING LIGHT EMITTING ELEMENT

CROSS-REFERENCE TO RELATED APPLICATION

The present application is a Divisional Application of U.S. Ser. No. 10/573,058 filed Mar. 21, 2006, which application claims the benefit and priority of PCT/JP2004/013111 filed Sep. 9, 2004, which claims priority of Japanese application no. 2003-329318 filed Sep. 22, 2003, which are incorporated herein in their entirety.

BACKGROUND OF THE INVENTION

1. Technical Field

The present invention relates to a mounting method and mounting device for a light emitting element, for use at the time of mounting a light emitting element such as a laser chip or LED on a board or the like.

2. Background Art

In general, in order to carry out bonding of electronic parts to a board with high precision, an arrangement is usually made wherein an alignment mark is provided on the electronic parts beforehand, this alignment mark and a mark on the board are subjected to alignment, and then bonding of the electronic parts to the board is carried out. However, providing an alignment mark on parts leads to a problem wherein the accuracy of positioning on a board is also affected by the margin of error in providing an alignment mark, as well as an increase in cost.

For an electronic light emitting element such as a laser chip or LED, it is desirable to carry out bonding onto a board based on the optic axis along which the light emitting element emits light.

FIG. 18 illustrates an example in which an edge-emitting-type laser chip 100 is bonded to a waveguide board 101. A waveguide 102 for letting light pass is horizontally formed in the waveguide board 101, alignment is performed such that this waveguide 102 is on the optic axis of the laser chip 100, and bonding is performed through an electroconductive connecting material 103. To the portion on the side opposite to the portion of the waveguide board 101 to which the laser chip 100 is bonded across the waveguide 102, an optical fiber 104 is attached so as to align its axial center with the axial center of the waveguide 102. Thus, the light generated by the laser chip 100 is transmitted to an optical communications line through the optical fiber 104.

When bonding the laser chip 100 to the waveguide board 101 as described above, alignment should be precisely performed such that the waveguide 102 and the optic axis of the laser chip 100 are on the same axis. To this end, the optic axis of the laser chip 100 needs to be aligned with the waveguide 102 in the X-axis, Y-axis (optic-axis direction), Z-axis, and θ-axis (compare FIG. 14) directions. In particular, accuracy of positioning on the order of a micron in the X-axis direction and in the Z-axis direction is necessary.

Patent Document 1: Japanese Examined Patent Application Publication No. 7-46747.

In Patent Document 1, a method has been proposed wherein an intermediate chip is disposed on a post on the basis of a positioning plate, a laser chip is disposed on this intermediate chip, the laser chip is made to emit light, correction of rotational direction is performed based on the light emission direction thereof, following which bonding of the three articles of the post, intermediate chip, and laser chip is simultaneously carried out. However, this method includes making the laser chip emit light, recognizing the direction thereof, and performing rotation correction on that occasion, so only rough adjustment can be performed with this method, and attempting to adjust the orientation with high precision requires time. Also, the relative spatial relationships between the laser chip and the post are not recognized, so that in the event of mounting a laser chip on a waveguide board, high accuracy of position cannot be expected even with this method.

Patent Document 2: Japanese Examined Patent Application Publication No. 7-105575

In Patent Document 2, a method has been proposed wherein a laser chip is disposed on an intermediate stage, the laser chip is made to emit light, the X, Y, and θ axes of the optic axis thereof are measured, the light emission direction is corrected depending on the measurement, following which the laser chip is subjected to bonding to the post or the like. In this case, the light emission direction of the laser chip can be recognized with precision, but the relative spatial relationships as to the post serving as an object to be bonded cannot be recognized, so the position and attitude of a mounting state cannot necessarily be secured. In particular, bonding is frequently accompanied with not only pressure but also heating, and consequently, attitude error is caused due to heat deformation or the like at the time of heat bonding, and therefore accuracy of position in the mounting state is not high.

Patent Document 3: Japanese Unexamined Patent Application Publication No. 2000-150970

Patent Document 3 describes a method for performing image recognition of the outer diameter datum point coordinates of and the luminescence center of a light emitting element, and an element. See FIGS. 9 and 10. This method relates to a method for mounting two or more light emitting elements having an upward optic axis on a board such that the luminescence center thereof becomes equal intervals, and the spatial relationships between the two or more light emitting elements can be set precisely, but the board has nothing used as a datum reference, and accordingly, the relative positions in a mounting state between the light emitting elements and the board cannot be secured. Accordingly, even if this method is applied to mounting a laser chip on a waveguide board, high accuracy of position between the waveguide board and the laser chip cannot be obtained.

SUMMARY OF THE INVENTION

The present invention is directed to provide a mounting method and mounting device for a light emitting element, which can perform positioning as to an object with precision on the basis of the optic axis of a light emitting element, and can mount the element on the object.

In order to achieve the above object, a feature of the method invention provides a method of mounting a light emitting element by suctioning a first part serving as a light emitting element having an optic axis toward the horizontal direction at the lower end portion of a suction head, and mounting this first part while aligning it with a second part held on a stage, this method comprising the steps of preparing: a first optical system disposed above the suction head; a second optical system disposed below the stage such that the optic axis thereof and the first optical system generally face each other; and a third optical system disposed such that the optic axis thereof and the first optical system are generally orthogonal; inserting the suction head between the first optical system and the second optical system, capturing a head reference mark, which is appended to the suction head and can be recognized from above, using the first optical system, capturing the first part suctioned at the suction head using the second optical system, also making the first part emit light, and recognizing the optic axis thereof using the third optical system; inserting a stage between the first optical system and the second optical system, capturing the second part held on the stage using the first optical system, and also capturing a stage reference mark, which is appended to the stage and can be recognized from below, using the second optical system; calculating the relative position between the first part and the suction head using the image information from the above first optical system, second optical system, and third optical system, and the relative position between the second part and the stage; recognizing the above head reference mark and stage reference mark using the above first and second optical systems in a state in which the above suction head and stage are moved to a mounting position, subjecting at least one of the suction head and the stage to position correction using that position information and the above relative position information such that the positions of the first part and the second part are in a predetermined relation; and mounting the first part and the second part following the above position correction.

A feature of the apparatus invention includes a device for mounting a light emitting element by mounting a first part serving as a light emitting element having an optic axis toward the horizontal direction while aligning this with a second part, the device comprising: a suction head for suctioning the first part at the lower end portion thereof, and having a head reference mark which can be recognized from above; a stage for holding the second part at the upper end portion thereof, and having a stage reference mark which can be recognized from below; a driving mechanism for relatively moving the above suction head and stage in the X, Y, Z, and θ directions; a first optical system, which is disposed above the suction head, for capturing the second part held on the stage and the head reference mark; a second optical system, which is disposed below the stage so as to generally face the optic axis of the first optical system, for capturing the first part suctioned at the suction head and the stage reference mark; a third optical system, which is disposed such that the direction of the optic axis thereof is generally orthogonal as to the first optical system, for capturing the optic axis at the time of making the first part emit light; a calculating device for calculating the relative position between the first part and the suction head, and the relative position between the second part and the stage using the image information from the above first through third optical system; a control device for recognizing the above head reference mark and stage reference mark using the above first and second optical systems in a state in which the above suction head and stage are moved to a mounting position, subjecting the suction head and the stage to position correction using those position information and the above relative position information such that the positions of the first part and the second part have a predetermined relation.

Following is a description of an example of a mounting method according to an embodiment of the invention.

First, the first optical system, second optical system, and third optical system are prepared. Here, the term "optical system" can include not only a single camera body but also a mirror, lens, and so forth, and is not restricted to one optical system comprising one camera, so two or three optical systems may comprise one camera, and inversely, one optical system may comprise two or more cameras.

The first optical system of which the optic axis faces downwards is disposed above the suction head, and the second optical system of which the optic axis faces upwards is disposed below the stage. The optic axes of the first optical system and second optical system generally face each other, and have known spatial relationships. The third optical system is disposed such that its optic-axis direction is generally orthogonal to the first optical system, and the third optical system is preferably disposed such that at least a part of its imaging visual field includes the visual field of the first optical system. Note that in the event that the sizes of the first part and second part serving as subjects become greater than an estimated visual field, it is preferable that the first optical system and the second optical system can move in the planar direction as a unit.

Next, the suction head is inserted between the first optical system and the second optical system; a head reference mark, which is appended to the suction head, and can be recognized from above, is captured using the first optical system; the first part suctioned at the suction head is captured using the second optical system; the first part is made to emit light and the optic axis thereof is simultaneously captured using the third optical system. That is to say, the X, Y coordinates (Y axis is the direction of the optic axis) of the head reference mark can be recognized with the first optical system, the Y coordinate of the first part can be recognized with the second optical system, and the X, Z coordinates of the optic axis of the first part which emitted light can be recognized with the third optical system. Note that the Z coordinate is not always necessary to be recognized. Thus, the relative positions in the X, Y direction between the suction head and the electroluminescent center of the first part can be obtained from the captured data of the three optical systems.

Next, the stage is inserted between the first optical system and the second optical system, the second part held on the stage is captured using the first optical system, and also a stage reference mark, which is appended to the stage and can be recognized from below, is captured using the second optical system. The relative positions in the X, Y direction between the second part and the stage can be calculated by recognizing the position of the second part from the image information of the first optical system, and recognizing the position of the stage (stage reference mark) from the image information of the second optical system.

Note that the step of capturing the suction head and the first part, and the step of capturing the stage and the second part may be performed in any order.

As described above, the relative positions in the X, Y direction between the first part and the suction head, and the relative positions in the X, Y direction between the second part and the stage can be calculated, using the image information from the first through the third optical systems.

Next, the head reference mark and the stage reference mark are recognized using the first and second optical systems in a state in which the suction head and the stage are moved to a mounting position, the suction head and the stage are subjected to position correction using that position information and the above relative position information such that the positions of the first part and the second part are in a predetermined relation. In this state, upon mounting the first part and the second part, the relative positions of both parts in a mounting state can be secured, and accordingly, mounting can be performed in a state in which alignment is performed with high precision.

Note that with the present invention, the term "position" represents the positions in the X, Y, Z direction, and the orientation in the θ direction generically. Accordingly, the "position" includes "attitude".

With the method according to the present invention, position security (the suction head and the stage are in a state in which alignment is performed with high precision; see paragraph 23) under mounting is performed while capturing the reference marks provided to both head and stage, so accuracy required as an axial mechanism can be extracted only to position resolution, and accordingly, highly precise reproducibility is not needed. Consequently, a cheap axial mechanism can be employed. Also, reproducibility errors such as heat deformation and lost motion can be corrected when mounting. As a result, this invention is applicable even when mounting electronic parts with which the accuracy of position of sub-micron order is demanded.

It is not necessary to always hold the first, second, and third optical systems in fixed spatial relationships. They should be in known spatial relationships at least at the time of capturing. For example, one of the optical systems may be temporarily moved away at the time of insertion of the head or the stage, and it may be returned to the original position after that. A reproducible mechanism needs to be used for the moving mechanism of the optical systems in this case.

Further, since mounting work can be carried out while capturing using the first through third optical systems, the gap between the first part and the second part under mounting is also detectable. Accordingly, for example, with the bump connecting construction method or the like, since this heat modification is recognized at any time and the positions of the first and second parts can be corrected even if the head and the stage cause heat deformation with the heat of a heater, accurate positioning is possible also under heating conditions.

In the event of bonding a light emitting element such as a laser chip to a waveguide board or the like, the accuracy of position in the X-axis direction (in the case that the Y axis is the direction of the optic axis) and the Z-axis direction between the optic axis of the light emitting element and the waveguide board is important. As for the Z-axis direction, if a pedestal is provided on the waveguide board for example, and the height from the bottom of the light emitting element to its optic axis, the height of the pedestal, the height of the optic axis of the waveguide, and the like are processed with high precision beforehand, it is possible to conform to the optic axis of the Z direction. However, as for the accuracy of position in the X direction, even if a working face is provided on the board beforehand, the accuracy between the position of the optic axis and the side-end face of the light emitting element is not always high, so that accuracy in the X direction cannot be secured.

With the present invention, the position of the optic axis in the X direction of the first part (light emitting element) is recognized with the third optical system, the positions of the X, Y direction of the second part are recognized with the first and second optical systems, so the first part can be precisely subjected to positioning as to the second part in the X direction.

According to another feature, the step of preparing the first optical system and the second optical system may include a step of measuring the amount of optic-axis deviation between the first optical system and the second optical system by inserting a single calibration mark, which can be recognized from both above and below, between the first optical system and the second optical system, and capturing this calibration mark using the first optical system and the second optical system.

Even if the optic axes of the first optical system and the second optical system are adjusted beforehand so as to face each other precisely on the same axis, deviation between the optic axes due to time, temperature change, and so forth cannot be prevented from occurrence, and also it is difficult to maintain highly precise accuracy of position, such as on the order of sub-microns. To this end, the amount of optic-axis deviation between both optical systems is obtained by recognizing the same mark from both upper and lower sides using the first optical system and the second optical system, and accurate alignment can be performed without adding an error by performing calculation of the relative position between the first part and the suction head, calculation of the relative position between the second part and the stage, and further position correction between the suction head and the stage, and the like using the above amount of optic-axis deviation.

The height in the Z-axis direction at the insertion position of the calibration mark is preferably set to the height of the bonded surface.

Note that performing calibration each time mounting parts is performed maintains the highest precision, but calibration may be performed for every predetermined number of mounting parts, or every set period.

According to another feature, the step of preparing the first optical system and the third optical system may include a step of measuring the amount of optic-axis deviation between the first optical system and the third optical system by inserting a calibration mark of which the relative spatial relationships from above and from the horizontal direction are known between the first optical system and the third optical system, and capturing this calibration mark using the first optical system and the third optical system.

Although the optic axis of the first optical system and the optic axis of the second optical system need to be generally orthogonal for measuring the amount of optic-axis deviation in the orthogonal direction thereof, the amount of optic-axis deviation can be readily recognized by inserting a calibration mark of which the relative spatial relationships from above and from the horizontal direction are known between the first optical system and the third optical system, and capturing this calibration mark. Accurate alignment can be performed without adding an error by performing calculation of the relative position between the first part and the suction head, and the like using this amount of optic-axis deviation.

According to another feature, as for the calibration mark for measuring the amount of optic-axis deviation between the first optical system and the second optical system, or the calibration mark for measuring the amount of optic-axis deviation between the first optical system and the third optical system, a mark provided on the suction head or the stage may be employed.

Although the calibration mark may be a mark provided on another member different from the suction head and the stage, providing the calibration mark on the suction head or the stage leads to an advantage wherein another member for calibration becomes unnecessary, and also the configuration becomes simple.

Note that the calibration mark needs to be recognized simultaneously from the multiple optical systems. To this end, a vertical through-hole may be provided on the suction head or the stage, or a mark provided on a transparent body (glass plate) and so forth, or the like may be employed as the calibration mark.

According to another feature, with the process for making the first part emit light, and recognizing the optic axis thereof using the third optical system, the emitting light state of the first part is measured, and the first part is preferably discarded as a defective article without proceeding to subsequent processing, in the event that the emitting light state thereof deviates from the reference value.

Although a selection process of the first part serving as a light emitting element may be performed separately, simultaneously performing the selection process at the time of measuring the optic axis according to another feature enables the number of processes to be reduced and productivity to be increased.

According to another feature, the first optical system, second optical system, and third optical system are preferably held at fixed spatial relationships throughout all of the processes for alignment so as to prevent the optic axes of the mutual optical systems from deviation.

Thus, if a position is recognized using the first through third optical systems to which the relative positions are always fixed, influence of the error due to a moving mechanism can be lessened compared with the case in which the optical systems are moved mutually, thereby enabling accuracy of positioning to be improved, and also requiring no advanced moving mechanism.

According to another feature, the position correction process between the suction head and the stage at the mounting position may include the steps of: recognizing the head reference mark and stage reference mark using the first and second optical systems, and subjecting the suction head and the stage to temporal tacking (temporary joint) using the relative position information such that the positions of the first part and the second part have a predetermined relation; and consecutively capturing the head reference mark and the stage reference mark using the first and second optical systems while heating one of or both suction head and stage for bonding, and subjecting the suction head and the stage to relative position correction so as to maintain the relative spatial relationships of the temporal tacking process.

In this case, position correction is performed after any heat modification during mounting, so even if there is heat modification, the first part and the second part can be always positioned and mounted with sufficient accuracy.

According to another feature, the process for mounting the first part and the second part preferably measures the relative distance in the vertical direction between the first part and the second part using the third optical system, and mounts the first part and the second part while correcting the bonding gap thereof.

For example, in the event that the second part is a waveguide board having a waveguide in the horizontal direction, alignment in the Z direction between the optic axis of the end face of the first part (light emitting element) and the waveguide is important. In particular, when bonding is performed by heating, the amount of heat modification is large, and reproducibility is not expectable, so heat modification cannot be predicted beforehand.

To this end, if the relative distance in the vertical direction between the first part and the second part is measured using the third optical system for optic-axis measurement, and is corrected in real time, the mounting height to the second part of the first part is accurately controllable.

According to another feature, at least one of the suction head and the stage preferably comprises: a part suction hole; a hollow portion which is provided behind the suction hole, and communicates with the part suction hole; a transparent body which closes the end away from the part suction hole of the hollow portion, so that the part suction hole can be seen through the transparent body from behind; an air suctioning path connected to the hollow portion; and a heater for heating which is fixed near the part suction hole; wherein the part suction hole can be recognized through the transparent body as a head reference mark or stage reference mark.

That is to say, the part suction hole is a hole for suctioning the first part or the second part, and is located near the parts. Accordingly, employing the part suction hole as a head reference mark or stage reference mark makes the amount of relative position deviation the least, even if heat modification is in the suction head or the stage.

Also, since the part suction hole serving as a reference mark can be looked at through a fluoroscope from behind the head (or stage) via the transparent body, capturing can be easily performed from behind the head (or stage) using the optical systems even in the middle of mounting. That is to say, the position of the head (or stage) in the middle of mounting can be accurately recognized, thereby enabling high-precision positioning.

In the event that the first part and the second part are mounted while applying heat and pressure thereto, heat can be most efficiently conveyed to the parts and improvement in bonding performance can be realized by providing a heater near the position nearest to the parts, i.e., the part suction hole.

Note that upon the head (or stage) being heated, distortion due to fluctuation of surrounding air occurs in an image captured by the optical system, which becomes a cause of error. However, in the event of employing the suction head or stage having the configuration according to an embodiment of the invention, although the hollow portion is also heated by the heat from the heater, since the hollow portion is decompressed by air suction from the air suctioning path, the density of air is low and there is little fluctuation. Consequently, when the part suction hole is captured through the transparent body and the hollow portion, the accurate captured data which has few errors due to fluctuation can be obtained.

According to another feature, the suction head or the stage is preferably attached to the driving mechanism via a bracket, and a cavernous portion into which the first or second optical system can be inserted for capturing the part suction hole via the transparent body is preferably formed in the bracket.

Although the head (or stage) is driven in the X, Y, Z, or θ-axis direction with the driving mechanism, since the back of the transparent body is wide open when this head is supported by a cantilever support structure to the driving mechanism, it is easy to dispose a camera, mirror, or the like behind the transparent body. However, since the head having the cantilever support structure may be bent by pressurization when bonding the first part and the second part, highly precise bonding is difficult. On the other hand, in the event that the back of the head is supported to the driving mechanism or the like via the bracket, even when pressure is applied, the head does not bend easily, and highly precise bonding can be attained. However, the bracket becomes obstructive, and makes a camera or the like hard to put back. To this end, while a camera does not interfere with the bracket but can capture the part suction hole easily by supporting with the back of the head, in particular, the bracket which has the cavernous portion behind the transparent body, the head (or stage) can be stabilized and supported to the driving mechanism.

Note that with the present invention, the term "optical system" includes not only a camera but also portions having a function to reflect an image toward a camera using a mirror, prism, lens, and so forth. Accordingly, only optical systems for capturing other than a camera, such as a mirror, prism, and lens may be inserted in the cavernous portion.

According to another feature, the mounting device preferably comprises a power source unit for making the first part emit light when recognizing the optic axis of the first part using the third optical system.

As for the power source unit, a unit having a configuration which can be moved away in the horizontal direction is preferred, so as not to interfere with the suction head or a stage. In the event that the first part is a light emitting element having an electrode on both the back-and-front (upper and under) surfaces, a pair of probes of the power source unit cannot be simultaneously contacted to the back-and-front side of the light emitting element where the suction head is suctioned. To this end, for example, the light emitting element can be made to emit light easily by providing an electrode in the suction side of the suction head, contacting this electrode and one electrode of the light emitting element, and contacting a pair of the probes of the power source unit to the electrode of the suction head, and the electrode of another side of the light emitting element.

As can be clearly understood from the above description, according to several aspects of the present invention, the relative position between the suction head and the first part and the relative position between the second part and the stage are recognized using the first through third optical systems, following which the first part and the second part are mounted, whereby the relative positions of both parts in a mounting state can be recognized correctly, and highly precise mounting can be realized. In particular, since the first part recognizes the relative position with the Suction head on the basis of the optic axis thereof, the first part can be mounted on the second part with high precision on the basis of the optic axis.

Also, since the relative position between the suction head and the first part, and the relative position between the second part and the stage are recognized using the multiple optical systems as mentioned above, and mounting is performed, accuracy required as an axial mechanism in which the suction head and the stage are driven can be made only into position resolution, and highly precise reproducibility is not needed. Accuracy of positioning on a board is only affected by an axial mechanism in which the suction head and the stage are driven. Accordingly, very highly precise mounting can be performed while adopting an inexpensive axial mechanism.

Further, mounting work can be performed while capturing it from the upper and lower sides by the first and second optical systems, and capturing it from the side by the third optical system, so reproducibility errors, such as heat modification and lost motion, can be corrected during mounting. Consequently, accurate positioning is possible also under heating conditions.

BRIEF DESCRIPTION OF DRAWINGS

These and other features and advantages of several embodiments of the invention, will be described herein, with reference to the drawings, in which.

DETAILED DESCRIPTION OF THE EMBODIMENTS

First Embodiment

Figure 1:
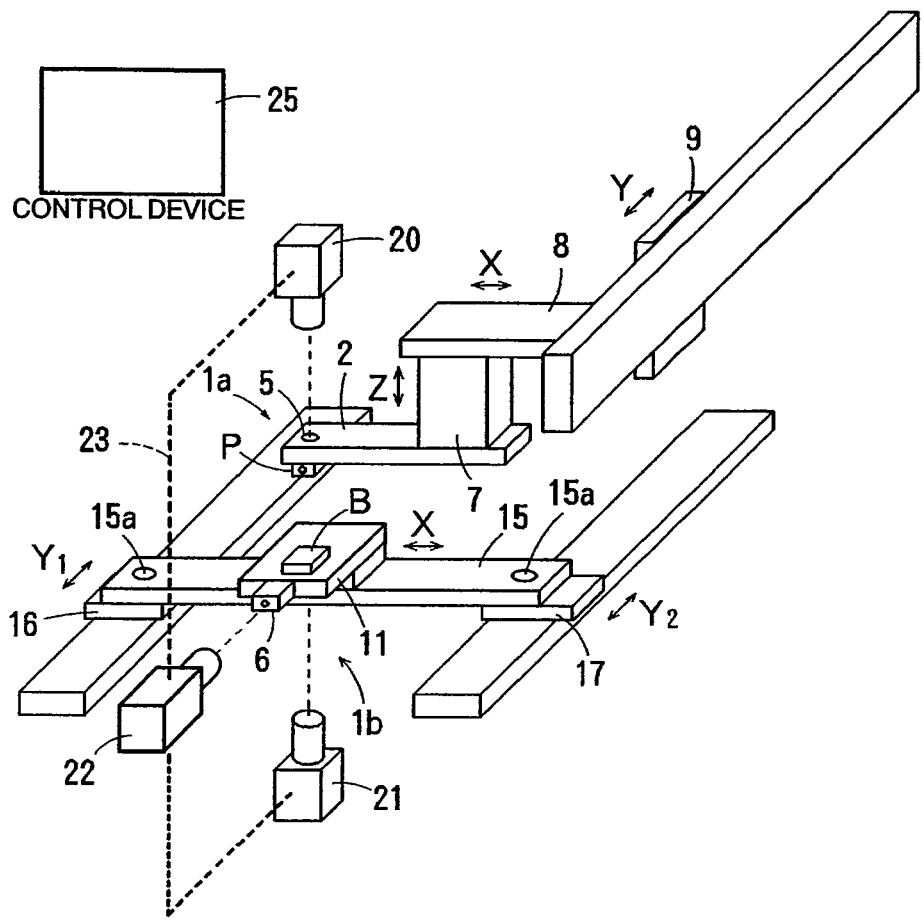
FIG. 1 is a perspective view of a first embodiment of a mounting device using a mounting method according to the present invention.
Figure 2:
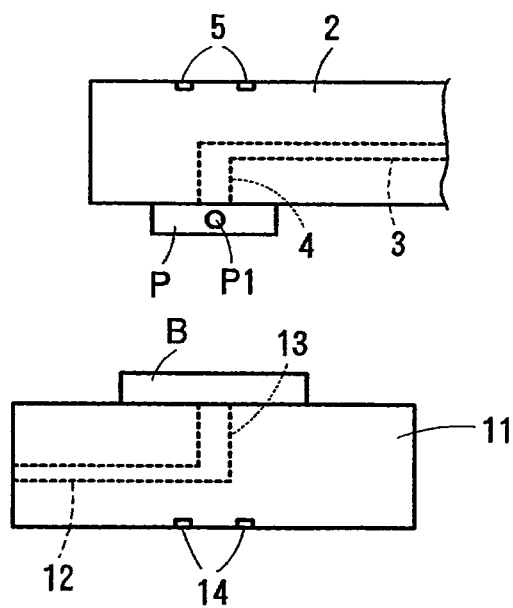
FIG. 2 is an enlarged view of the suction head and the stage of the mounting device shown in FIG. 1.
Figure 3:
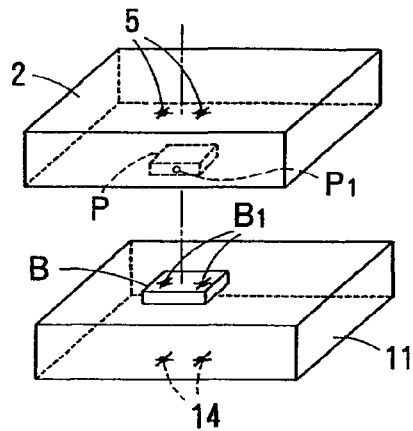
FIG. 3 is a perspective view of the suction head and the stage of the mounting device shown in FIG. 1.

FIG. 1 through FIG. 3 illustrate a first embodiment of a mounting device using a mounting method according to the present invention. Here, an edge-emitting-type laser chip P serving as a first part, and a board B serving as a second part, will be employed.

The mounting device of this example comprises a head section 1a, a stage section 1b, a first camera 20, a second camera 21, a third camera 22, a control device 25, and so forth.

The head section 1a comprises a suction head 2 for suctioning the laser chip P, and driving mechanisms 7, 8, and 9 for driving the suction head 2 in the X, Y, Z-axis direction. The suction head 2, as shown in FIG. 2, comprises a suctioning hole 3 connected to an unshown vacuum suctioning device, and a part suction hole 4 which opens on the undersurface is provided at the tip of the suctioning hole 3, and the laser chip P is suctioned by this part suction hole 4. A head reference mark 5 is provided on the upper surface of the suction head 2, particularly at a position corresponding to the part suction hole 4. In order to improve the reproducibility of the position in the θ-axis direction, the reference mark 5 may be multiple point-like marks as shown in FIG. 3, or may be a directional shape (e.g., rectangle etc.). Also, an electroluminescent portion P1 is provided on the edge of the laser chip P, and laser light is emitted in the transverse direction from this electroluminescent portion P1.

Heating means (not shown) for heating the laser chip P may be provided on the suction head 2.

The suction head 2 is attached to an X-axis driving mechanism 8 through a Z-axis driving mechanism 7, and the X-axis driving mechanism 8 is further connected to a Y-axis driving mechanism 9. Accordingly, the suction head 2 can move to an arbitrary position in the X, Y, Z-axis directions.

The suction head 2 suctions the laser chip P at an unshown supply position, and conveys the laser chip P to a mounting position to mount it on a board B.

Figure 4:
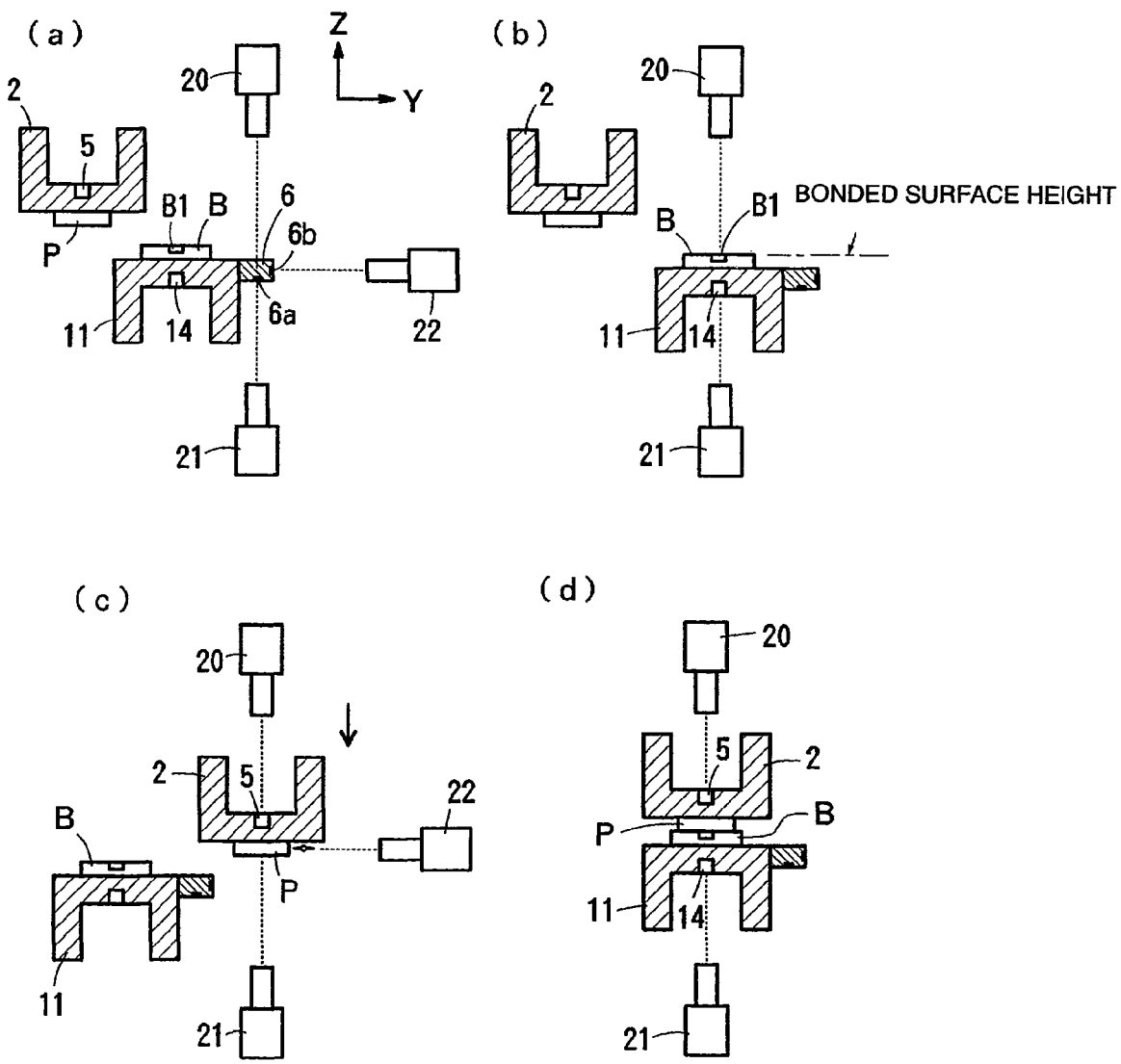
FIG. 4 is an explanatory diagram of an alignment operation of the mounting device shown in FIG. 1.

The tip portion of a stage 11, as shown in FIG. 4, is provided with a transparent body 6 having calibration marks 6a and 6b for recognizing the amount of optic-axis deviation between the first camera 20 and the second camera 21, and the amount of optic-axis deviation between the first camera 20 and the third camera 22. The calibration mark 6a is a mark which can be recognized from both above and below, and is made up of a mark or the like which is formed on the upper face or lower face of the transparent body 6 using a thin-film method such as plating. The calibration mark 6b is a mark which can be recognized from the side, and is made up of a mark or the like which is thin-film-formed on the side face of the transparent body 6. Both of calibration marks 6a and 6b are set with the fixed spatial relationships.

Note that the calibration marks 6a and 6b are not restricted to the case of being formed on the transparent body 6. A mark obtained by forming a hole or the like in an un-transparent member may also be taken as a calibration mark. Also, calibration marks may be provided on the suction head 2 instead of the stage 11.

A stage section 1b comprises the stage 11 holding the board B, and driving mechanisms 15, 16, and 17 for driving this stage 11 in the X, Y, and O-axis directions. This stage 11, as shown in FIG. 2, comprises a suctioning hole 12 connected to an unshown vacuum suctioning device, a part suction hole 13 which opens on the upper surface is provided at the tip of the suctioning hole 12, and the board B is suctioned by this part suction hole 13, and held. A stage reference mark 14 is provided on the undersurface of the stage 11, particularly on a back position corresponding to the part suction hole 13. This reference mark 14, as with the head reference mark 5, may be multiple point-like marks as shown in FIG. 3, or may be a directional shape (e.g., rectangle etc.). Also, an alignment mark B1 is provided on the board B, corresponding to the reference mark 14.

Heating means (not shown) for heating the board B may be provided on the stage 11.

The stage 11 is attached to an X-axis driving mechanism 15, and the two ends of the X-axis driving mechanism 15 are connected respectively to a Y1-axis driving mechanism 16 and a Y2-axis driving mechanism 17 via a hinge 15a. Accordingly, by changing the amount of movement of Y1-axis driving mechanism 16 and the amount of movement of Y2-axis drive mechanism 17, angle adjustment of the stage 11 can be carried out in the O-axis direction. Therefore, the stage 11 can move to an arbitrary position in the X, Y, θ-axis directions.

The stage 11 has a function for receiving the board B at the unshown supply position, and conveying this to the mounting position.

The first camera 20 and the second camera 21 are installed above the suction head 2 and below the stage 11 at the mounting position respectively, and the third camera 22 is installed at the side of the mounting position. As for the third camera 22, a camera known as the NFP optical system is employed for example, and the height of the optic axis thereof is preferably slightly higher than the bonded surface height. The second camera 21 preferably has a capturing visual field which can capture the entire laser chip P. The relative positions of the first and second cameras 20 and 21 are held by positioning means 23 (shown in FIG. 1 with a dashed line), such as a motor axis, such that the mutual optic axes of the cameras face generally on the same axis, and also the cameras do not carry out relative displacement. Also, the relative position of the third camera 22 is held by positioning means 23, such as a motor axis, such that the optic axes thereof is generally orthogonal to the first and second cameras 20 and 21, and also the cameras do not carry out relative displacement. Although the cameras 20, 21, and 22 preferably have an auto-focus function, an alternative procedure includes moving the first and second cameras 20 and 21 in the Z-axis direction, and moving the third camera 22 in the Y-axis (optic axis of the laser chip P) direction.

The control device 25 fetches the captured data of the first camera 20, second camera 21, and third camera 22, calculates from these data the amount of optic-axis deviation between the first camera 20 and the second camera 21, the amount of optic-axis deviation between the first camera 20 and the third camera 22, the position (and attitude) of the laser chip P, the position (and attitude) of the board B, the relative position (and attitude) between the head reference mark 5 and the laser chip P, the relative position (and attitude) between the stage reference mark 14 and the board B, and the like, stores these, and also has a function for controlling the driving mechanisms 7, 8, 9, 15, 16, and 17.

Now, one example of operation of the mounting device made up of the above configuration will be described in accordance with FIG. 4 and FIG. 5. In FIG. 4, (a) illustrates the calibration process of the first camera 20, second camera 21, and third camera 22. First, the suction head 2 is inserted between the first camera 20 and the second camera 21 which are disposed in the mounting position, and the calibration mark 6a is adjusted up to the bonded surface height. Then, the calibration mark 6a provided on the suction head 2 is captured using both cameras 20 and 21, and the amount of optic-axis deviation between both cameras 20 and 21 is obtained. The amount of optic-axis deviation is utilized for calculation of the relative position between the laser chip P and the suction head 2, which will be described later, calculation of the relative position between the board B and the stage 11, position correction between the suction head 2 and the stage 11, and the like. Similarly, the calibration mark 6b is captured using the third camera 22. At this time, the calibration marks 6a and 6b are set at the fixed spatial relationships, whereby the amount of optic-axis deviation between the first camera and the third camera 22 can be obtained.

In FIG. 4, (b) illustrates a state in which the suction head 2 is moved away, and the stage 11 is placed in the mounting position, i.e., the position where the upper face of the board B is at the bonded surface height. In this state, an alignment mark B1 of the board B on the stage 11 is captured using the first camera 20, and at the same time, the reference mark 14 behind the stage 11 is captured using the second camera 21, and the X, Y coordinates position of the board B and the X, Y coordinates position of the stage 11 are obtained. Subsequently, the spatial relationships between the board B and the stage 11 are stored using the image information from the first camera 20 and the second camera 21.

In FIG. 4, (c) illustrates a state in which the stage 11 is moved away, and the suction head 2 is lowered to the mounting position, i.e., the laser chip P suctioned by the suction head 2 is lowered to a position where it is at the bonded surface height. The laser chip P is made to emit light at this position (optic-axis direction is Y-axis). Subsequently, the XY coordinates of the head reference mark 5 are recognized using the first camera 20, the Y coordinate of the electroluminescent face of the laser chip P (right-side face in FIG. 4(c)) using the second camera 21, and the X, Z coordinates of the optic axis of the laser chip P using the third camera 22. At this time, the visual field of the second camera 21 can recognize the entire laser chip P, so the Y coordinate of the electroluminescent face can be readily recognized. Subsequently, the spatial relationships between the laser chip P and the suction head 2 are stored using the image information from the first camera 20 through third camera 21.

Note that the focal distance of the first camera 20 and the second camera 21 in FIGS. 4(b) and (c) is different from the focal distance when recognizing the calibration mark 6a (FIG. 4(a)), so an auto-focus function is preferably employed so as to clearly recognize the head reference mark 5, alignment mark B1, and stage reference mark 14, and so forth.

Figure 5:
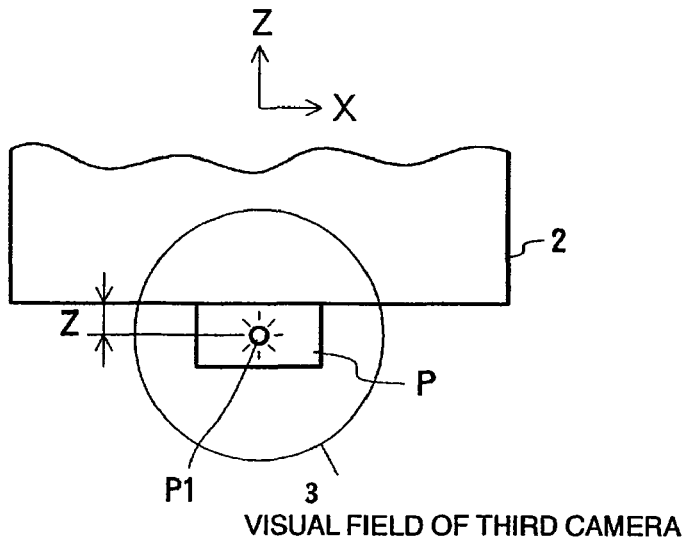
FIG. 5 is a diagram of the suction head and a laser chip as viewed from the third optical system direction.

FIG. 5 illustrates a situation of the suction head 2 and the laser chip P as viewed from the third camera direction. The X coordinate of an electroluminescent portion P1 of the laser chip P is recognized using the third camera 22, and the relative position in the X direction between the laser chip P and the suction head 2 can be obtained from the above recognized X coordinate, and the XY coordinates of the head reference mark 5 recognized using the first camera 20. Also, the relative position in the Z direction between the optic axis of the laser chip P and the suction head 2 can be recognized from the position information in the Z direction of the optic axis of the laser chip P by the third camera 22, and Z position information of the position sensor provided on the suction head 2 for example.

The Z position information of the optic axis of the laser chip P, for example, may be the height Z between the electroluminescent portion P1 of the laser chip P and the undersurface of the suction head 2, or the height between the electroluminescent portion P1 and the undersurface of the laser chip P, and further, by providing a mark on the side of the suction head 2 within the visual field of the third camera 22, may be the height between this mark and the electroluminescent portion P1.

FIG. 4(d) shows a mounting process wherein the stage 11 is moved to the same position as FIG. 4(b) while holding the suction head 2 at the mounting position, and the laser chip P is mounted on the board B. At this time, positioning in the Z direction should be performed using the position sensor provided in the suction head 2, such as a commercially available linear scale and photo-sensor. Note that a standard curve of heat deformation in the Z direction when heating is determined beforehand, such as by experimental trial or simulation. Then the deformation can be formed for a predetermined heat condition, and used to correct the laser chip and board positioning in the Z direction.

Following the position recognition in FIG. 4(b), the stage 11 is moved away in FIG. 4(c), and then, when returning the stage 11 to the mounting position in FIG. 4(d), the board B cannot necessarily return with sufficient reproducibility to the position in FIG. 4(b) depending on the accuracy of the driving mechanisms 15 through 17. Since the field of view of the first camera 20 is blocked by the suction head 2, the board B cannot be recognized directly with the first camera 20. Accordingly, in the mounting process, the reference mark is recognized using the second camera 21, the stage 11 is moved in the XY direction based on the relative position data calculated in FIG. 4(b) such that the position of the board B is conformed to the position of the laser chip P in FIG. 4(c). The suction head 2 is held in the position in FIG. 4(c), so since there is no position deviation in the laser chip P, it is only necessary to perform position correction of the board B. Note that if there is deviation in the θ-axis direction, the stage 11 should be moved in the θ direction. Thus, alignment in the XYZ direction between the laser chip P and the board B can be accurately performed, and a highly precise product can be obtained by mounting in this state.

FIG. 4 illustrates an example wherein first the spatial relationships between the board B and the stage 11 are recognized, next the spatial relationships between the suction head 2 and the laser chip P are recognized, and while holding the laser chip P on the mounting position, the board B is moved to the mounting position, and mounting is performed. However, mounting may be performed by another method, an example of which will now be described. That is to say, first the spatial relationships between the suction head 2 and the laser chip P are recognized, next the spatial relationships between the board B and the stage 11 are recognized, and while holding the board B on the mounting position, the laser chip P is moved to the mounting position, and mounting is performed.

With the positioning process shown in FIG. 4, in the event that mounting is performed while heating, the suction head 2 or the stage 11 may cause heat deformation in the middle of mounting. Therefore, even if alignment is correctly performed just before mounting, when mounting is completed, the laser chip P and the board B may not agree correctly.

To deal with such a case, the following method can be used in the mounting process (refer to FIG. 4(d)).

First, the head reference mark 5 and the stage reference mark 14 are recognized using the first and second cameras 20 and 21, and the suction head 2 and the stage 11 are temporarily stopped at the position where the positions of the laser chip P and the board B agree using the above-mentioned relative position information. At this time, the laser chip P and the board B only touch lightly.

While heating one or both of the suction head 2 and the stage 11 for bonding (e.g., 350 degrees/5 seconds or more), it is pressurized, and the head reference mark 5 and the stage reference mark 14 are consecutively captured using the first and second cameras 20 and 21 in the meantime. Subsequently, the suction head 2 and the stage 11 are subjected to relative position correction so as to maintain the relative spatial relationships in the above temporary stop process.

If the method as described above is employed, even if deviation of the XY direction occurs in the middle of mounting, the cameras 20 and 21 will detect the deviation and correct it in real time, thereby enabling accurate bonding.

In FIG. 4, the amount of heat deformation in the Z direction when heating is instructed beforehand, but deformation of 10 μm or so may actually occur, and the reproducibility may also be poor. To this end, measuring the gap between the laser chip P and the board B using the third camera 22, and mounting the laser chip P on the board B while performing correction in real-time enables the optic axis of the laser chip P to be aligned with the height appropriate for the board B.

Figure 6:
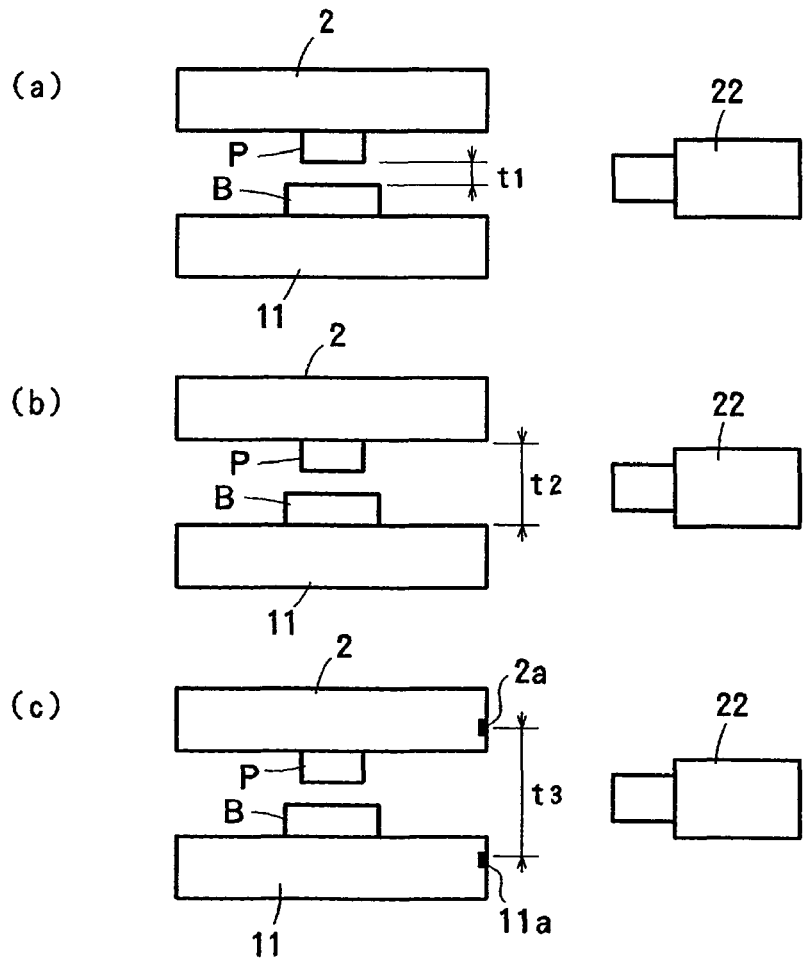
FIG. 6 is a diagram illustrating a method for measuring the gap between a laser chip P and a board B using the third optical system.
Figure 7:
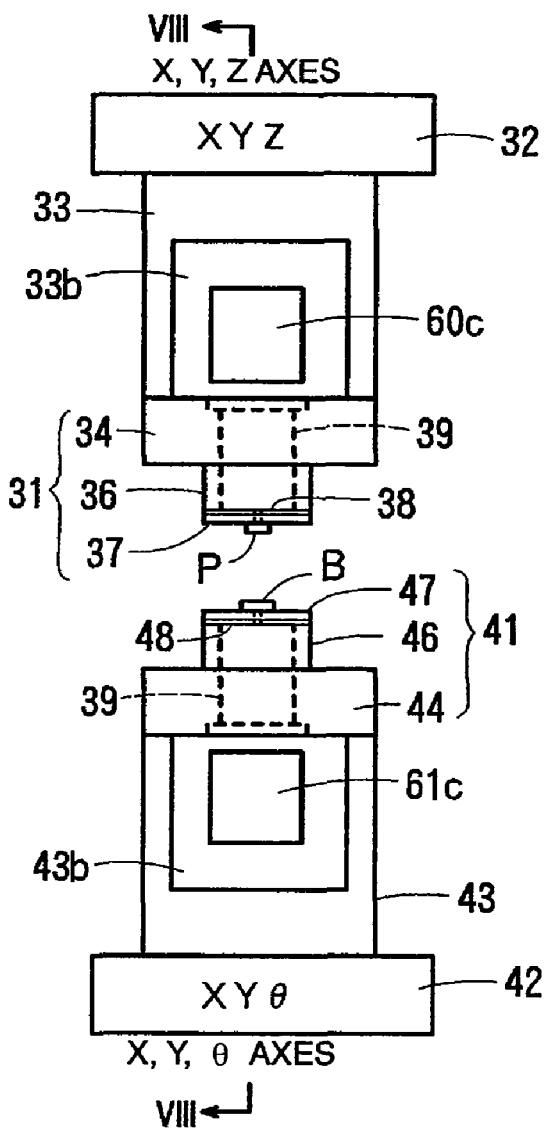
FIG. 7 is a front view of a second embodiment of a mounting device using the present method invention.

As for the method of measuring the gap, three kinds of methods as shown in FIG. 6 can be considered.

The first measuring method is, as shown in FIG. 6(a), a method for measuring a gap t1 from the outline end faces of the laser chip P and the board B.

The second measuring method is, as shown in FIG. 6(b), a method for measuring a gap t2 from the outline end faces of the suction head 2 and the stage 11.

The third measuring method is, as shown in FIG. 6(c), a method for measuring a gap t3 from reference marks 2a and 11a provided on the suction head 2 and the stage 11.

Employing one of the above-mentioned methods enables the bonding gap between the laser chip P and the board B to be adjusted arbitrarily, while performing recognition correction using an image. Note that with the second and third measuring methods, when the optic axis of the laser chip P has been recognized, it is necessary to recognize the relative position between the optic axis and the end face or reference mark of the head 2.

Second Embodiment

FIG. 7 through FIG. 11 illustrate a second embodiment of a mounting device according to the present invention.

The mounting device of this example comprises a head section 30 and a stage section 40, first through third optical systems 60, 61, and 66, and a control device (not shown).

The head section 30 comprises a suction head 31 for suctioning a laser chip P, a driving mechanism 32 for driving in the X, Y, Z-axis directions for example, and a bracket 33 for connecting the suction head 31 to the driving mechanism 32. The bracket 33 comprises a pair of supporting walls 33a which face, and a cavernous part 33b passing through in the X-axis direction is provided therebetween. The first optical system 60 (mirror portion) is inserted, with freedom of moving in and out, in this cavernous part 33b from the X-axis direction.

Figure 9:
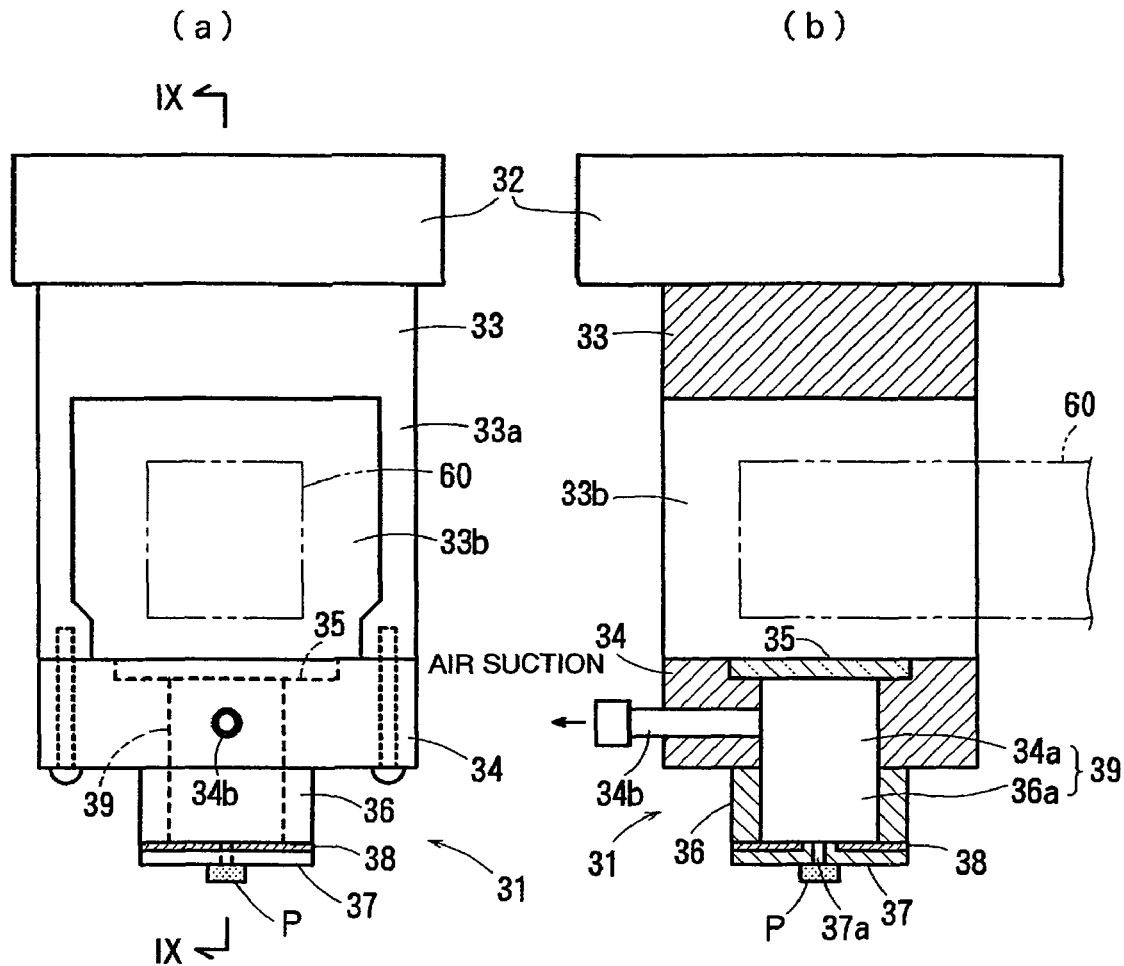
FIG. 9 is an enlarged view of the suction head of the mounting device shown in FIG. 7, wherein (a) is a front view, and (b) is a cross-sectional view taken along the IX-XI line.

The suction head 31, as shown in FIG. 9, comprises a base member 34, a transparent plate 35 made up of clear glass or the like fixed to the upper surface of the base member 34, a cylindrical member 36 made up of thermal insulation fixed to the undersurface of the base member 34, an attachment member 37 fixed to the lower end portion of the cylindrical member 36, and a heater 38 sandwiched between the attachment member 37 and the cylindrical member 36. The above base member 34 is fixed to the lower end of the supporting walls 33a with screws or the like. The attachment member 37 is preferably formed with a thermally conductive material as much as possible.

A hole 34a vertically passing through is provided in the central portion of the base member 34, this passing-through hole 34a is communicated with an internal hole 36a of the cylindrical member 36, and a hollow portion 39 is made up of these holes 34a and 36a. The upper surface of the hollow portion 39 is closed by the transparent plate 35. The base member 34 is connected with an air piping 34b which is communicated with the hollow portion 39, and this air piping 34b is connected to an unshown vacuum suctioning device, and makes up an air suctioning path.

A through-hole is provided in the center portion of the heater 38, the heater 38 is fixed to the attachment base 37 in a concentric manner such that this through-hole and the part suction hole 37a formed in the center portion of the attachment member 37 align. The laser chip P is suctioned to the lower-side opening portion of the part suction hole 37a.

As described above, the hollow portion 39, which communicates with the part suction hole 37a, is formed behind the part suction hole 37a of the suction head 31, and the surface thereof facing the part suction hole 37a of the hollow portion 39 is closed with the transparent plate 35. A cavernous portion 33b is provided in the bracket 33 for connecting the head 31 to the driving mechanism 32, and the part suction hole 37a can be readily recognized through the transparent plate 35 using the first optical system 60 inserted in this hollow portion 33b. That is to say, the part suction hole 37a can be employed as a head reference mark. In order to detect an angle deviation of the rotational direction, it is preferable to make the upper-side opening portion of the part suction hole 37a in a shape having directivity, such as a rectangle.

Figure 10:
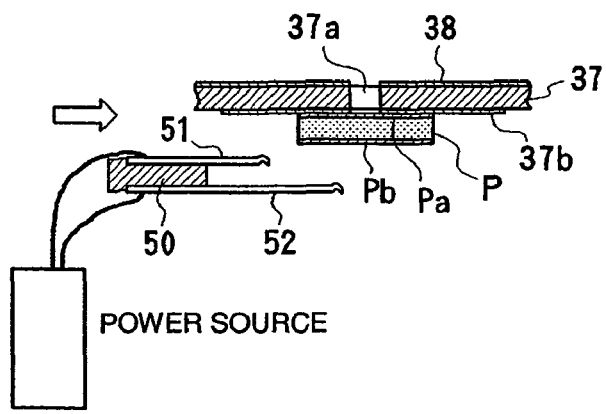
FIG. 10 is a diagram illustrating the configuration of an electric power unit.

As shown in FIG. 10, an electrode 37b is provided on the surface of the attachment member 37 of the suction head 31, and upon the suction head 31 suctioning the laser chip P of which the front-and-back sides have electrodes Pa and Pb, the upper surface electrode Pa of the laser chip P comes into contact with the electrode 37b and conducts electricity. In this state, upon probes 51 and 52 of a power source unit 50 coming into contact with the electrode 37b and the undersurface electrode Pb respectively, the laser chip P can be made to emit light.

Figure 11:
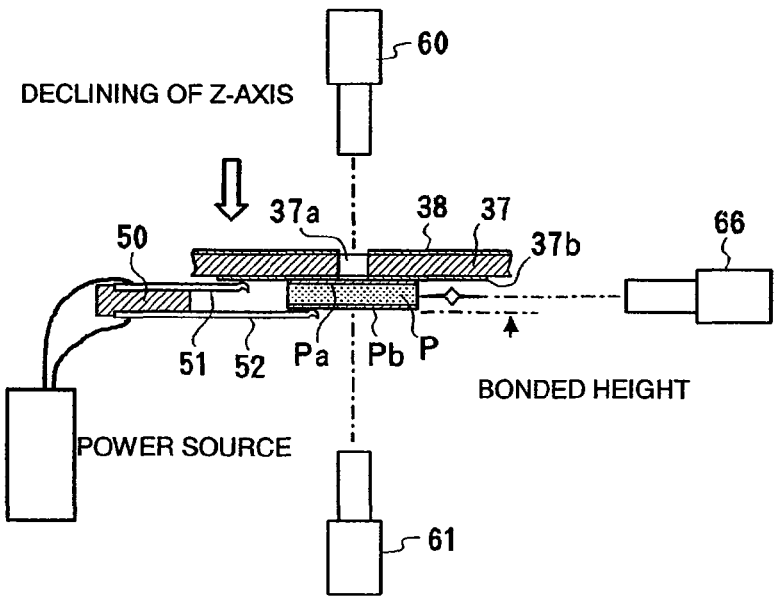
FIG. 11 is a diagram illustrating a state in which electric power is supplied to the laser chip with the electric power unit.

FIG. 11 illustrates the power source 50 in the optic-axis recognizing position (refer to FIG. 4(c)). Upon the suction head 31 being dropped into contact with the power source unit 50, the probes 51 and 52 come into contact with the electrode 37b and the undersurface electrode Pb respectively, so that the laser chip P emits light and this optic axis can be captured by the third optical system 66.

The stage section 40 comprises a stage 41 for suctioning and holding the board P, a driving mechanism 42 for driving in the X, Y, and O-axis directions for example, and a bracket 43 for connecting the stage 41 to the driving mechanism 42. Since the stage 41 and the suction head 31 are made into a vertically symmetrical configuration, and the bracket 43 and the bracket 33 are made into a vertically symmetrical configuration, the reference numerals of the principal components are listed below, and redundant descriptions thereof will be omitted. That is to say, 43b is a cavernous portion, 44 a base member, 44b air piping, 45 a transparent plate, 46 a cylindrical member, 47 an attachment member, 47a a part suction hole, 48 a heater, and 49 a hollow portion. In this case as well, the part suction hole 47a can be captured through the transparent plate 45 using the second optical system 61 (mirror portion) inserted in the cavernous portion 43b from the X-axis direction, and the part suction hole 47a can be employed as a head reference mark.

The first optical system 60 is attached to a support portion 63 provided on an XY-axis driving mechanism 62 via a Z1-axis driving mechanism 64, and the second optical system 61 is attached to the support portion 63 via a Z2-axis driving mechanism 65. The third optical system 66 is attached to the support portion 63 via Y-axis driving mechanism 67.

The first optical system 60 comprises a camera 60a, a cylindrical lens 60b extending in the X-axis direction, and a prism or mirror 60c attached to the tip of the lens 60b, and this mirror 60c is inserted in the cavernous portion 33b of the bracket 33. An arrangement is made wherein the light of the part suction hole 37a is reflected by the mirror 60c, and the light can be captured through the lens 60b using the camera 60a.

Similarly, the second optical system 61 comprises a camera 61a, a cylindrical lens 61b extending to the X-axis direction, and a prism or mirror 61c, and this mirror 61c is inserted in the cavernous portion 43b of the bracket 43. Since the mirrors 60c and 61c are small cross sections compared with the cavernous portions 33b and 43b, the margin on a space exists in the XYZ direction. Accordingly, even in the event of moving the suction head 31 and the stage 41 at the time of position recognition, mounting, or position correction, interference between the brackets 33 and 43 and the mirrors 60c and 61c can be prevented.

The first through third optical systems 60, 61, and 66 preferably have an auto-focus function.

The first optical system 60 and the second optical system 61 are supported by the support portion 63 such that the mutual optic axes face on the same axis, and also the cameras are not relatively moved in the XY direction. The third optical system 66 is supported by the support portion 63 such that the optic axis thereof is orthogonal to the optic axis of the first optical system 60, and also the camera thereof is not relatively moved in the XZ direction. Also, in order to recognize the amount of optic-axis deviation between the first optical system 60 and the second optical system 61, one side of the part suction holes 37a and 47a provided in the suction head 31 or the stage 41 can be employed as a calibration mark.

In order to accommodate a case in which multiple parts P are mounted on the large-sized board B, both optical systems 20 and 21 are capable of integrally moving in the XY direction by the XY-axis driving mechanism 62.

Also, auto-focus adjustment in each of the optical systems 60, 61, and 66 may be performed independently by adjusting the first optical system 60 in the vertical direction using the Z1-axis driving mechanism 64, adjusting the second optical system 61 in the vertical direction using the Z2-axis driving mechanism 65, and adjusting the third optical system 66 in the horizontal direction using the Y-axis driving mechanism 67.

The operation of the mounting device of the above example is the same as that in the first embodiment shown in FIG. 4, so the description thereof will be omitted. Note that in the event of employing the part suction hole 37a of the suction head 31 or the part suction hole 47a of the stage 41 as a calibration mark, the suction head 31 or the stage 41 should be inserted between the vertical optical systems 60 and 61, and the amount of optic-axis deviation should be measured, prior to suctioning the laser chip P or the board B.

With the second embodiment, the part suction holes 37a and 47a are employed as a head reference mark and a stage reference mark. Since the part suction holes 37a and 47a are located in the position nearest to the part P and the board B, even if there is some deformation in the suction head 31 or the stage 41, the amount of relative position deviation between the part P and the suction head 31 and the amount of relative position deviation between the board B and the stage 41 are minimal. Since the part suction hole serving as a reference mark can be looked at through a fluoroscope from behind the head (or stage) via the transparent body, the position of the head (or stage) can be accurately recognized even in the middle of mounting, thereby enabling high-precision positioning.

Also, both of the suction head 31 and the stage 41 include the heater 38 or heater 48, so the laser chip P can be mounted on the board B while applying heat and pressure thereupon. In this case, the heaters 38 and 48 are provided in the position extremely near to the part suction holes 37a and 47a, so heat can be conveyed to the part P and the board B most effectively, whereby improvement of bonding performance can be realized. Also, upon the head (or stage) being heated, distortion due to fluctuation of surrounding air occurs in an image captured by the camera, which becomes a cause of error, but since the hollow portion 39 is decompressed by air suction from the air suctioning path 34b, the density of air is low and there is little fluctuation. Consequently, when capturing the part suction hole 37a through the transparent body 35 and the hollow portion 39, accurate captured data which has few errors due to fluctuation can be obtained.

With the second embodiment, an arrangement has been made wherein the mirror portions 60c and 61c provided in the first optical system 60 and the second optical system 61 are inserted in the cavernous portions 33b and 43b, but in the event that the optical systems can be configured in small size, an arrangement may be made wherein the lens portions 60b and 61b, and the mirror portions 60c and 61c are omitted, and the cameras 60a and 61a are directly inserted in the cavernous portions 33b and 43b.

Also, an arrangement has been made wherein the stage 41 and the suction head 31 are made in a vertically symmetrical configuration, and also the bracket 43 and the bracket 33 are made in a vertically symmetrical configuration, but an arbitrary configuration may be employed depending on the shapes and sizes of the first part (light emitting element) P and the second part (board) to deal with.

The structural member which is supported by a pair of the supporting walls 33a as shown in the above example has been the brackets 33 and 43, so the suction head 31 and the stage 41 can be supported at both ends as to the driving mechanisms 32 and 42, and bending of the suction head 31 and the stage 41 due to the pressurization power at the time of mounting can be prevented. In addition, the brackets 33 and 43 include the cavernous portions 33b and 43b to which the mirror portions 60c and 61c of the optical systems 60 and 61 can be inserted freely, and accordingly, the head reference marks 37a and 47a can be readily recognized in the middle of mounting.

Third Embodiment

Figure 8:
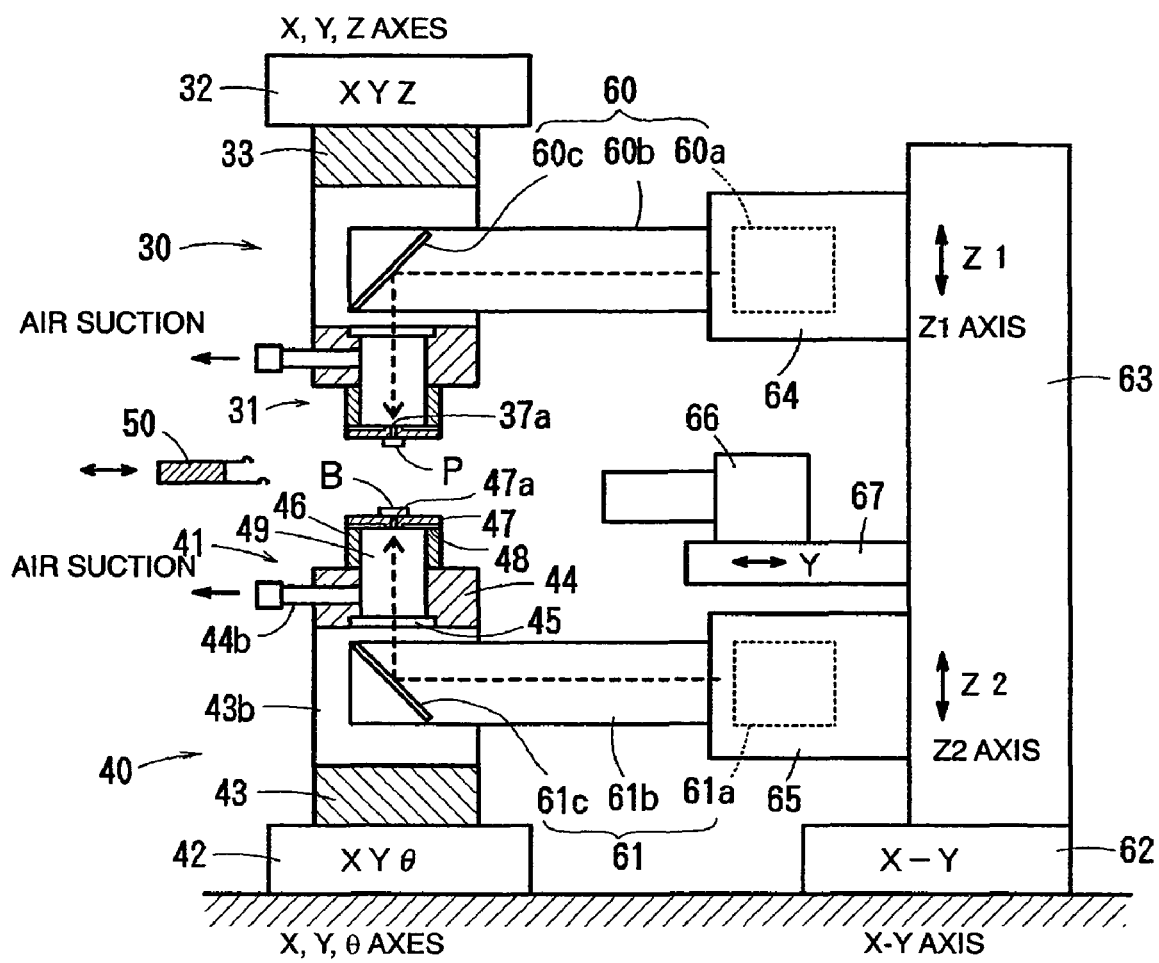
FIG. 8 is a cross-sectional view taken along the line VIII-VIII in FIG. 7.
Figure 12:
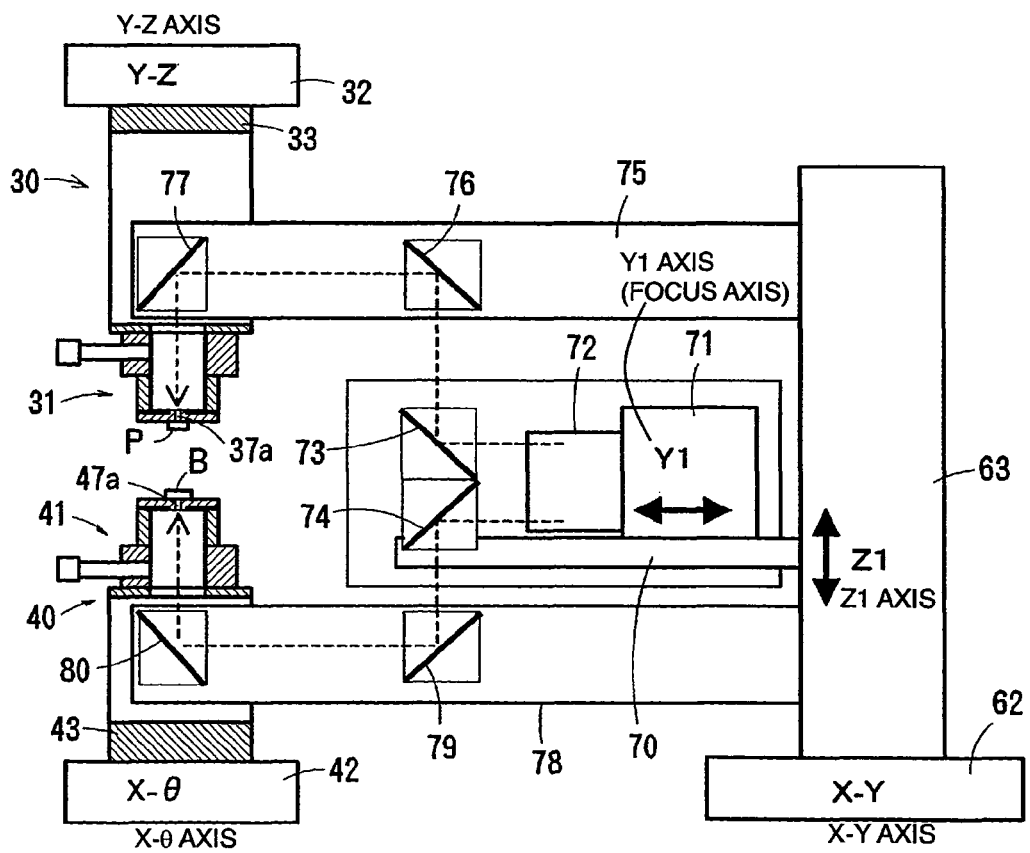
FIG. 12 is a front view of a third embodiment of a mounting device using the present invention method.
Figure 13:
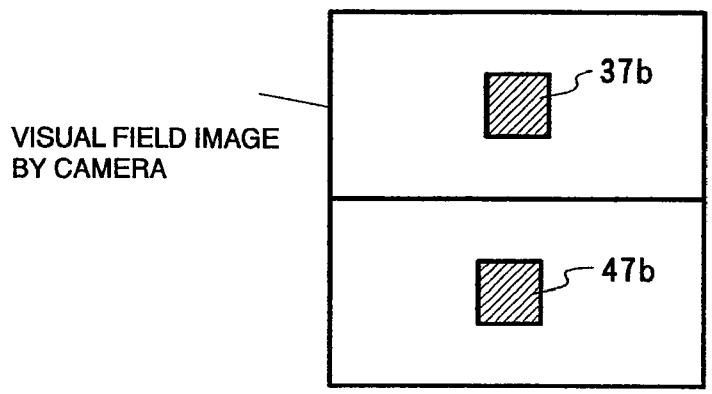
FIG. 13 is a diagram illustrating visual field images of a camera according to the example in FIG. 12.

FIG. 12 and FIG. 13 is an example in which two optical systems (first optical system and second optical system) are made up of one camera, which is a third embodiment of a mounting device according to the present invention. The same components as those in the second embodiment shown in FIG. 8 are appended with the same reference numerals, and the redundant description thereof will be omitted.

In this example, a camera 71, a lens 72, and mirrors (or prisms) 73 and 74 which divide the visual field of the camera 71 into vertical halves are installed on a table 70 which is provided in a support portion 63 so as to move to the Z direction. The optic axis of the camera is bent upward by the mirror 73, and is bent downward by two mirrors (or prisms) 76 and 77 provided in a mirror support member 75 which cannot move in the Z-axis direction, and can capture a head reference mark 37a. On the other hand, the optic axis bent downward by the mirror 74 is bent upward by two mirrors (or prisms) 79 and 80 provided in a mirror support member 78 which cannot move in the Z-axis direction, and can capture a stage reference mark 47a. Thus, the two optical systems can be made up of the one camera 71.

FIG. 13 illustrates a visual field image using the camera 71. The image reflected to the upper half is the head reference mark 37a, and the image reflected to the lower half is the stage reference mark 47a. The foci of the images of the vertical optical systems can be simultaneously adjusted by moving the table 70 in the Z-axis direction, making the lengths of the optical paths of the vertical optical systems equal, and bringing the Y1 axis into focus.

Fourth Embodiment

Figure 14:
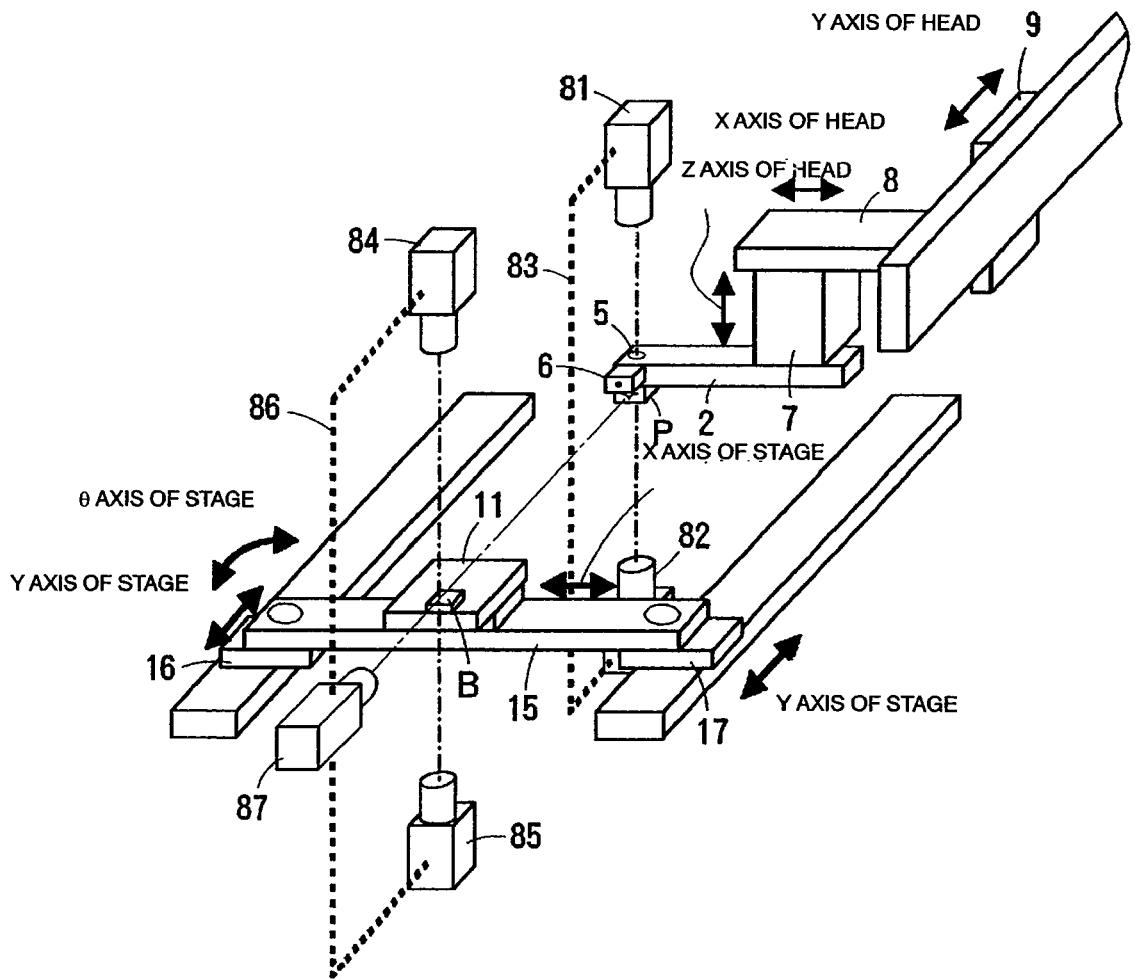
FIG. 14 is a perspective view of a fourth embodiment of a mounting device according to the present invention.

FIG. 14 and FIG. 15 illustrate a fourth embodiment of a mounting device according to the present invention. This example is a method for performing alignment at high speed by employing five cameras. FIG. 14 will be described as contrasted with FIG. 1, and FIG. 15 will be described as contrasted with FIG. 4. Note that the same components are appended with the same reference numerals, and the redundant description thereof will be omitted.

In FIG. 14, a first camera 81 and a second camera 82 are held by positioning means 83 such that both optic axes thereof face each other, and a third camera 84 and a fourth camera 85 are held by positioning means 86 such that both optic axes thereof face each other. Further, a fifth camera 87 is held by the positioning means 86 such that the optic axis thereof is orthogonal to the optic axes of the third camera 84 and the fourth camera 85. Note that the attachment position of the fifth camera 87 may be in the direction of movement and the right-angled direction of a head (the attachment position (optic-axis direction) of the fifth camera 87 may form a right angle with the direction of movement of the suction head; that is, the fifth camera 87 can alternatively be directed in the left-to-right direction as seen in FIG. 14). The relative position between the first camera 81 and the second camera 82, and the relative position between the third camera 84 and the fourth camera 85 are fixed in the XY direction, but are freely movable in a focus direction. Also, focal movement in the optic-axis direction is free for the 5th camera 87.

For example, the first camera 81 is employed for recognizing a head reference mark 5, and the second camera 82 is employed for recognizing a part P which has been suctioned to the suction head 2. Also, the third camera 84 is employed for recognizing a board B held on a stage 11 and the head reference mark 5 for example, and the fourth camera 85 is employed for recognizing a stage reference mark 14. The fifth camera 87 is used not only for recognizing the optic axis of the part P but also for recognizing the mounting height of the part P.

The operation of the mounting device made up of the above configuration will be described in accordance with FIG. 15.

Figure 15A:
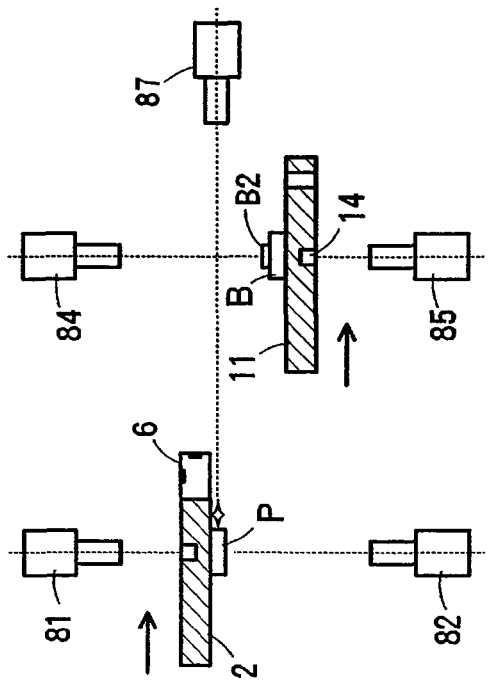
FIG. 15 is an explanatory diagram of an alignment operation of the mounting device shown in FIG. 14.
Figure 15B:
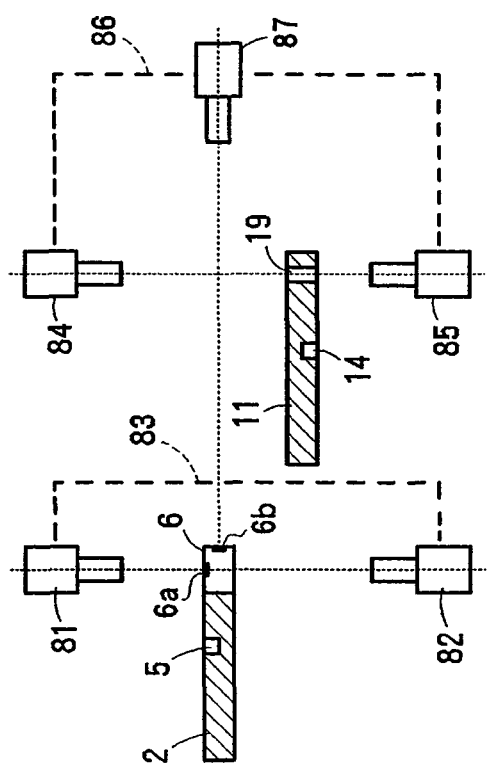

FIG. 15(a) shows a calibration process, wherein the tip portion of the suction head 2 is inserted between the first camera 81 and the second camera 82, a calibration mark 6a provided on the suction head 2 is captured using both of the cameras 81 and 82, the amount of optic-axis deviation between both of the cameras 81 and 82 is obtained, and simultaneously a calibration mark 6b is captured using the fifth camera 87. Similarly, the stage 11 is inserted between the third camera 84 and the fourth camera 85, a calibration mark 19 provided on the stage 11 using both of the cameras 84 and 85, and the amount of optic-axis deviation between both of the cameras 84 and 85 is obtained.

FIG. 15 (b) illustrates a state in which the part P suctioned to the suction head 2 is inserted between the cameras 81 and 82, and the board B held on the stage 11 is inserted between the cameras 84 and 85. Note that a connecting material B2 is attached to the board B. In this state, the relative position between the head reference mark 5 and the part P is recognized using the cameras 81 and 82, and the relative position between the board B and the stage reference mark 14 is recognized using the cameras 84 and 85. Simultaneously, the part P is made to emit light, and the optic axis position thereof is recognized using the fifth camera 87. Accordingly, the spatial relationships between the position of the part P, the mark of the head 2, and the optic axis is stored, and also the spatial relationships between the position of the board B and the mark 14 of the stage 11 is stored.

Figure 15C:
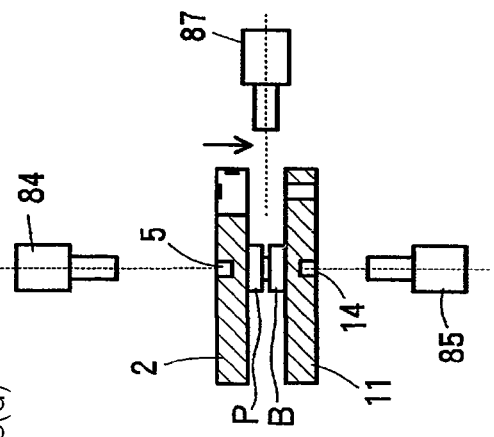

FIG. 15(c) illustrate a state in which the suction head 2 is moved between the third and fifth cameras 84 and 85, the head reference mark 5 is recognized using the third camera 84, the stage reference mark 14 is recognized using the fourth camera 85, and the head 2 is lowered such that the gap between the part P and the board B becomes a predetermined value using the fifth camera 87, and is subjected to temporary stop. Here, the suction head 2 and the stage 11 have been moved between the third and fourth cameras 84 and 85, but an arrangement may be made wherein the suction head 2 and the stage 11 are moved between the first and second cameras 81 and 82, the head reference mark 5 is recognized using the first camera 81, and the stage reference 14 is recognized using the second camera 82.

Figure 15D:
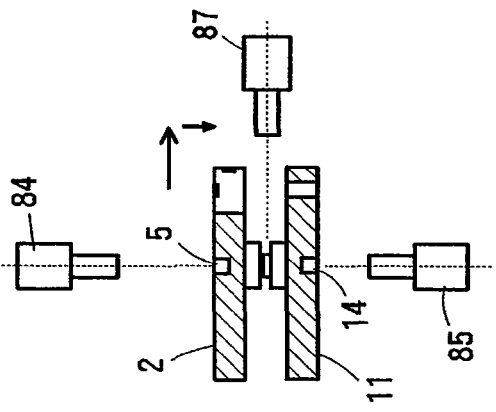

FIG. 15(d) is a bonding process, wherein bonding is performed between the part P and the board B while heating both. The position correction of the suction head 2 or the stage 11 can be performed in real time by capturing the marks 5 and 14 continuously using the third and fourth cameras 84 and 85 so that the relative position between the part P and the board B may not deviate by heating. Simultaneously, the gap between the part P and the board B is measured using the fifth camera 87, and the head height can be corrected in real time such that the gap thereof becomes a predetermined value. Accordingly, as shown in FIG. 18, the optic axis of the light emitting element can be accurately conformed to the waveguide of the waveguide board.

As described above, by employing two sets of camera pairs of the first and second cameras 81 and 82, and the third and fourth cameras 84 and 85, while one camera pair are capturing the suction head 2 side, the other camera pair can capture the stage 11 side, whereby alignment and mounting can be performed at high speed.

Note that if UV cured resin is used as the connecting material B2, UV is cast from the horizontal direction in the stage of FIG. 15(d) whereby bonding between the part P and the board B can be performed.

Figure 18:
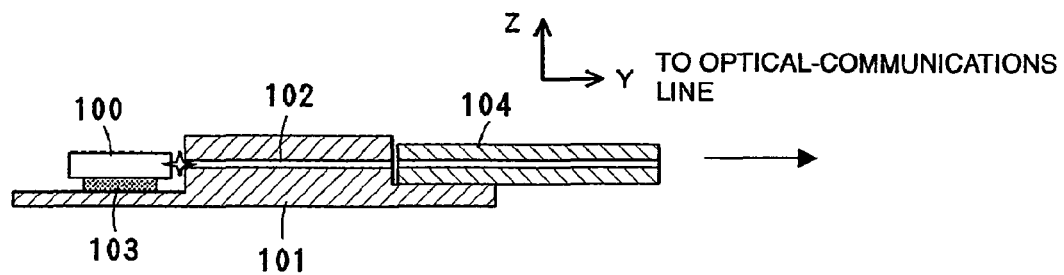
FIG. 18 is a diagram of a conventional example in which a laser chip is mounted on a waveguide board.

As described above, the fifth camera 87 is used not only for recognizing the optic axis of the part P but also for recognizing the mounting height of the part P, but in the event that the optical part P such as shown in FIG. 18 is mounted on the waveguide board B, even if recognition is attempted using the 5th camera 87 from the optic-axis direction of the part at the time of mounting, since the gap between the part P and the board B is hidden by the board B, it is undetectable. In such a case, another camera having an optic axis in the horizontal direction may be employed. In this case, a total of six cameras will be used. Note that as shown in FIGS. 6 (b) and (c), in the event of substituting the gap between the parts with the gap between the head and the stage and measuring it, it can be also used for optic-axis recognition of the part P and recognition of mounting height using the 5th camera 87.

With the first embodiment through the fourth embodiment, description has been made regarding examples in which one laser chip P is mounted on one board B. It is the same even in the event of mounting multiple laser chips P on one board B. However, in this case, it is necessary to provide alignment marks B1 as to the multiple mounting positions of the board B, and also provide multiple stage reference marks 14 on the stage 11 corresponding to these.

The present invention can be employed in a wide range of uses, such as a chip mounter which mounts a light emitting element on a board, a TAB bonder, and a flip chip bonder.

The mounting device of the present invention is not restricted to the configurations shown in the above examples, and any configuration can be employed as long as each of the processes or functions of the present invention can be implemented.

With the present invention, an arrangement has been made wherein the first optical system is disposed above the suction head, and the second optical system is disposed below the stage, but at least the portions (e.g., a lens, a mirror, etc.) which receive the light from a head reference mark and a stage reference mark should be located above the suction head and below the stage, and the cameras do not need to be disposed above the suction head and below the stage respectively. Accordingly, an arrangement may be made wherein multiple mirrors and prisms are employed, and these make light reflect in a camera disposed lateral to or below the suction head, or disposed lateral to or below the stage.

Figure 16:
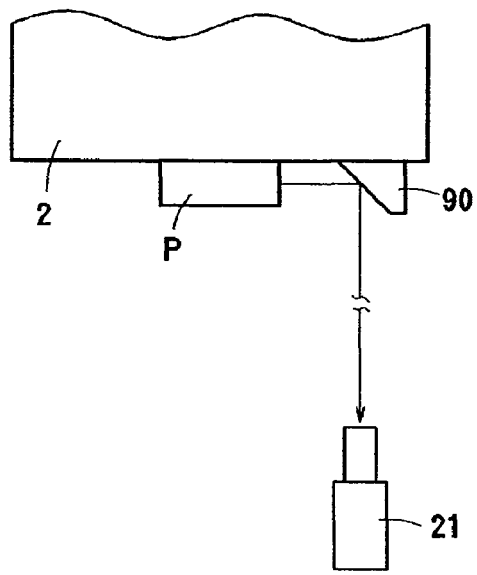
FIG. 16 is a diagram illustrating an example in which the light of a laser chip is reflected by a mirror.

In FIG. 4, the optic axis of the laser chip P has been captured using the third optical system 22 disposed in the direction orthogonal to the optic axis of the first optical system 20, but as shown in FIG. 16, an arrangement may be made wherein a reflective mirror 90 is provided on the undersurface of the suction head 2, and by bending the light of the laser chip P 90 degrees by the mirror 9, it is also possible to capture the optic axis of the laser chip P using the second optical system 21. In this case, the second optical system 21 can be made to serve a double purpose instead of the third optical system 22.

With the above examples, descriptions have been made regarding the case in which the laser chip is made to emit light, and the optic axis thereof is captured using the third optical system, and thus, the positions in the X direction and in the Z direction of the optic axis are recognized, but it is not necessarily required to recognize the position in the Z direction.

Figure 17:
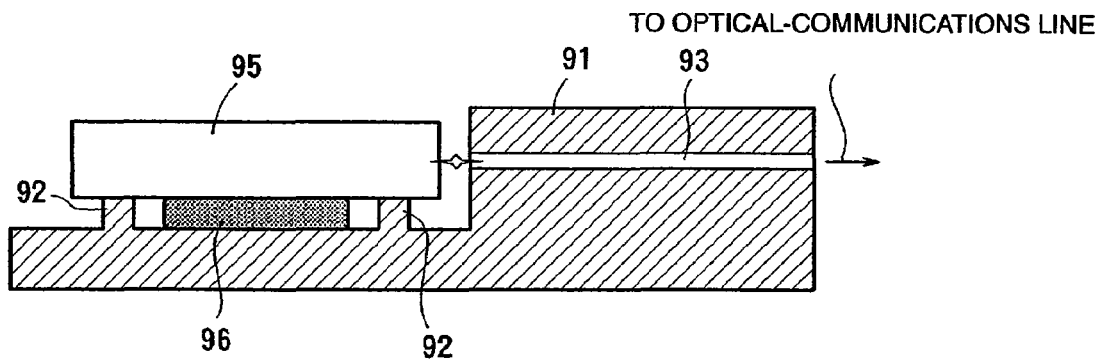
FIG. 17 is a diagram of an example in which a laser chip is mounted on a waveguide board using a pedestal.

For example, as shown in FIG. 17, in the event that the pedestal 92 used as a height reference is formed on the waveguide board 91, the optic axis of the laser chip 95 and the waveguide 93 of the waveguide board 91 can be correctly aligned in the Z direction only by bonding the laser chip 95 in a state in which it pushed against the pedestal 92, and accordingly, it is not necessary to recognize the position in the Z direction of the optic axis using the third optical system. Note that 96 denotes a metal connecting part.

Although the present invention has been described in relation to particular embodiments thereof, many other variations and modifications and other uses will become apparent to those skilled in the art. Therefore, the present invention is not limited by the specific disclosure herein.

What is claimed is:

1. A device for mounting a light emitting element by mounting a first part serving as a light emitting element having an optic axis toward the horizontal direction while aligning the first part with a second part, the device comprising:
    a suction head for suctioning the first part at the lower end portion of the suction head, and having a head reference mark which can be recognized from above;
    a stage for holding the second part at the upper end portion of the stage, and having a stage reference mark which can be recognized from below; a driving mechanism for relatively moving said suction head and stage in the X, Y, and θ directions;
    a first optical system, which is disposed above said suction head, for capturing the second part held on the stage and the head reference mark;
    a second optical system, which is disposed below said stage so as to generally face the optic axis of the first optical system, for capturing the first part suctioned at the suction head and the stage reference mark;
    a third optical system, which is disposed such that the direction of the optic axis thereof is generally orthogonal to the first optical system, for capturing the optic axis on the basis of light emitted by the first part;
    a calculating device for calculating the relative position between the first part and the suction head, and the relative position between the second part and the stage using image information from said first through third optical systems;
    a control device for recognizing said head reference mark and stage reference mark using said first and second optical systems with said suction head and stage in a mounting position, subjecting the suction head and the stage to position correction using said position information and said relative position information such that the positions of the first part and the second part are in a predetermined relation.

2. The device for mounting a light emitting element according to claim 1, wherein at least one of said suction head and stage comprises:
    a part suction hole;
    a hollow portion which is provided behind said suction hole, and communicates with the part suction hole;
    a transparent body which covers an end of the hollow portion such that the part suction hole can be seen through the transparent body;
    an air suctioning source connected to said hollow portion; and
    a heater which is fixed near said part suction hole;
    wherein the part suction hole can be recognized through said transparent body as a head reference mark or stage reference mark.

3. The device for mounting a light emitting element according to claim 2, wherein said suction head or stage is attached to said driving mechanism via a bracket;
    and wherein a cavernous portion is formed in said bracket, into which the first or second optical system can be inserted for capturing the part suction hole via said transparent body.

4. The device for mounting a light emitting element according to claim 1, further comprising a power source unit for making said first part emit light for enabling said third optical system to recognize the optic axis of the first part.

5. The device for mounting a light emitting element according to claim 1, wherein said third optical system captures the first part and the second part, or the suction head and stage from the side;
    wherein said calculation device calculates the relative distance in the vertical direction between the first part and the second part using the image information from the third optical system; and
    wherein said control device corrects a gap between the first part and the second part based on said relative distance information.

* * * * *